(12) United States Patent
Wojcik et al.

(10) Patent No.: US 11,411,041 B2
(45) Date of Patent: *Aug. 9, 2022

(54) FLEXIBLE SUBSTRATE MODULE AND FABRICATION METHOD

(71) Applicant: CARESTREAM HEALTH, INC., Rochester, NY (US)

(72) Inventors: Timothy J. Wojcik, Rochester, NY (US); Ravi K. Mruthyunjaya, Penfield, NY (US); Bradley S. Jadrich, North Port, FL (US)

(73) Assignee: Carestream Health, Inc., Rochester, NY (US)

( * ) Notice: Subject to any disclaimer, the term of this patent is extended or adjusted under 35 U.S.C. 154(b) by 845 days.

This patent is subject to a terminal disclaimer.

(21) Appl. No.: 16/603,424

(22) PCT Filed: May 15, 2017

(86) PCT No.: PCT/US2017/032584
§ 371 (c)(1),
(2) Date: Oct. 7, 2019

(87) PCT Pub. No.: WO2018/212744
PCT Pub. Date: Nov. 22, 2018

(65) Prior Publication Data
US 2020/0161366 A1 May 21, 2020

Related U.S. Application Data

(60) Provisional application No. 62/336,773, filed on May 16, 2016.

(51) Int. Cl.
*H01L 27/146* (2006.01)
*H01L 23/60* (2006.01)
(Continued)

(52) U.S. Cl.
CPC ........ *H01L 27/14663* (2013.01); *H01L 23/60* (2013.01); *H01L 27/14632* (2013.01);
(Continued)

(58) Field of Classification Search
CPC ......... H01L 27/14663; H01L 27/14632; H01L 27/14687; H01L 23/60; H01L 31/03926; H01L 31/1892
See application file for complete search history.

(56) References Cited

U.S. PATENT DOCUMENTS 6,510,195 B1 * 1/2003 Chappo ................. G01T 1/2018
250/370.09
6,559,451 B1 5/2003 Izumi et al.
(Continued)

OTHER PUBLICATIONS

International Search Report dated Mar. 29, 2018 for International Application No. PCT/US2017/032584, 2 Pages.

*Primary Examiner* — Blake C Riddick

(57) ABSTRACT

A digital radiographic image sensor includes a flexible first substrate with an image sensor array. A scintillator is formed over the array, and bonding pads in a peripheral region outside the array are connected to the array. A second substrate is attached to a bottom of the first substrate and includes a scribed or perforated break line to enable removal of a peripheral region of the second substrate.

14 Claims, 14 Drawing Sheets

(51) Int. Cl.
*H01L 31/18* (2006.01)
*H01L 31/0392* (2006.01)

(52) U.S. Cl.
CPC .. *H01L 27/14687* (2013.01); *H01L 31/03926* (2013.01); *H01L 31/1892* (2013.01)

(56) References Cited

U.S. PATENT DOCUMENTS

| | | | | |
|---|---|---|---|---|
| 2006/0071173 | A1* | 4/2006 | Zeman | G01T 1/2018 250/370.11 |
| 2006/0108683 | A1* | 5/2006 | Takeda | H01L 27/14663 257/723 |
| 2007/0035692 | A1 | 2/2007 | Shigematsu et al. | |
| 2007/0053498 | A1* | 3/2007 | Mandelkern | A61B 6/145 378/184 |
| 2008/0001241 | A1* | 1/2008 | Tuckerman | H01L 31/0203 257/434 |
| 2009/0261259 | A1* | 10/2009 | Yip | G01T 1/2018 250/370.09 |
| 2013/0048867 | A1* | 2/2013 | Cok | G01T 1/24 250/370.08 |
| 2013/0048868 | A1* | 2/2013 | Cok | H01L 27/14683 438/66 |
| 2016/0313458 | A1 | 10/2016 | Masuda et al. | |

* cited by examiner

FLEXIBLE SUBSTRATE MODULE AND FABRICATION METHOD

CROSS REFERENCE TO RELATED APPLICATIONS

This application claims the benefit of and is a U.S. National Phase filing of PCT Application PCT/US2017/032584 filed May 15, 2017 entitled "FLEXIBLE SUBSTRATE MODULE AND FABRICATION METHOD", in the name of Timothy J. Wojcik et al., which claims priority to U.S. Patent Application Ser. No. 62/336,773, filed May 16, 2016, in the name of Wojcik et al., and entitled FLEXIBLE SUBSTRATE MODULE AND FABRICATION METHOD.

BACKGROUND OF THE INVENTION

The subject matter disclosed herein relates to digital radiographic detector panels. In particular, to a DR image module apparatus and manufacturing methods that are based on the use of a flexible substrate image sensor array rather than glass.

Typically, amorphous silicon thin film transistors are combined with PIN photodiodes to create an imaging pixel in an array that may be fabricated on glass for large area digital radiographic (DR) detectors. Metal oxide TFT technology can also be used in manufacturing processes similar to amorphous silicon. It may be desirable to use flexible (e.g. polyimide) substrates rather than glass substrates for image sensors that are integrated into portable DR detectors to provide non-planar or curved configurations and to improve durability and reduce weight.

Processes have been demonstrated for coating a thin (typically 20-50 micron) layer of polyimide (PI) onto a release layer upon a glass carrier that allows the same semiconductor device fabrication processes to be run as if the devices were fabricated directly onto glass. Thus, known glass substrate module assembly process technology can be used, such as panel singulation with electrostatic discharge (ESD) shorting bar removal, scintillator lamination to the image sensor panel, and Chip-on-Film attach and/or rework on sensor bond pads.

In the case of the PI coated variation, the image sensor array may be removed from the glass carrier by laser exposure through the glass or by mechanical peeling. After release from the glass, the PI based image array may be laminated to a secondary substrate to provide geometric integrity and improved handling characteristics.

After fabricating the PI based image sensor, additional integration processes need to be conducted to create the digital radiographic core imaging subsystem module. These steps include probe testing of the image sensor panel, lamination or direct deposition of a scintillator (typically gadolinium oxysulfide or cesium iodide), disconnection of manufacturing process ESD protection circuitry that may degrade imaging performance due to high leakage current, tape automated bonding (TAB) of readout electronics using anisotropic conducting film (ACF), which may also require the ability to replace a TAB attached readout component if it is determined to be of unacceptable performance, and lamination of a backscatter shielding layer to improve image quality.

The discussion above is merely provided for general background information and is not intended to be used as an aid in determining the scope of the claimed subject matter.

BRIEF DESCRIPTION OF THE INVENTION

A digital radiographic image sensor includes a flexible first substrate with an image sensor array. A scintillator is formed over the array, and bonding pads in a peripheral region outside the array are connected to the array. A second substrate is attached to a bottom of the first substrate and includes a scribed or perforated break line to enable removal of a peripheral region of the second substrate.

In one embodiment, a digital radiographic image sensor includes a flexible first substrate with an image sensor array formed thereon. A bonding pad is formed in a peripheral region outside the array on the first substrate. A second substrate is attached to the first substrate. The second substrate includes a scribed or perforated break line to enable removal of a peripheral region of the second substrate along the break line.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
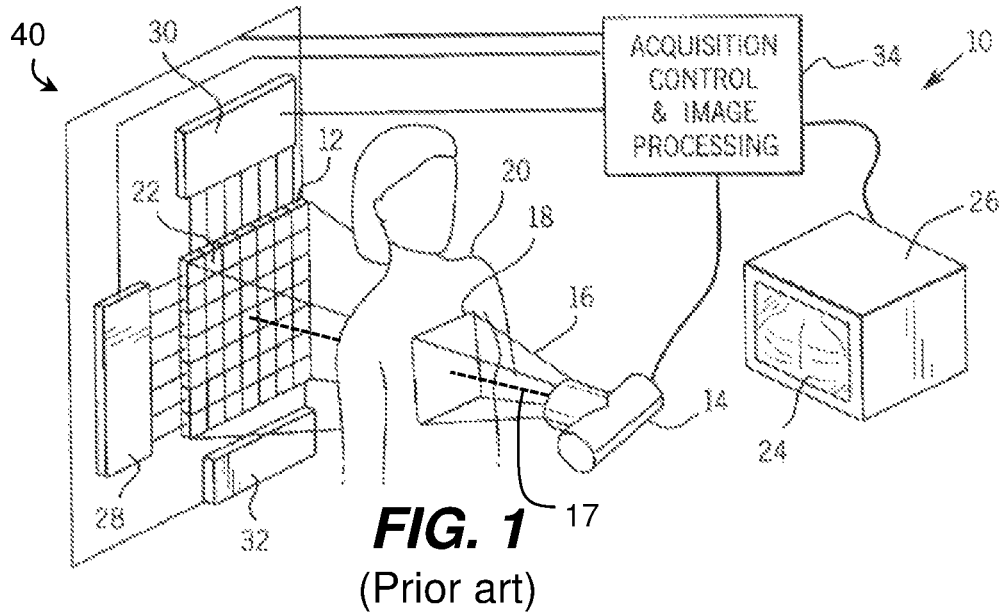
FIG. 1 is a schematic perspective view of an exemplary x-ray system.

FIG. 1 is a perspective view of a digital radiographic (DR) imaging system 10 that may include a generally curved or planar DR detector 40 (shown in a planar embodiment and without a housing for clarity of description), an x-ray source 14 configured to generate radiographic energy (x-ray radiation), and a digital monitor 26 configured to display images captured by the DR detector 40, according to one embodiment. The DR detector 40 may include a two dimensional array 12 of detector cells 22 (photosensors), arranged in electronically addressable rows and columns. The DR detector 40 may be positioned to receive x-rays 16 passing through a subject 20 during a radiographic energy exposure, or radiographic energy pulse, emitted by the x-ray source 14. As shown in FIG. 1, the radiographic imaging system 10 may use an x-ray source 14 that emits collimated x-rays 16, e.g. an x-ray beam, selectively aimed at and passing through a preselected region 18 of the subject 20. The x-ray beam 16 may be attenuated by varying degrees along its plurality of rays according to the internal structure of the subject 20, which attenuated rays are detected by the array 12 of photosensitive detector cells 22. The curved or planar DR detector 40 is positioned, as much as possible, in a perpendicular relation to a substantially central ray 17 of the plurality of rays 16 emitted by the x-ray source 14. In a curved array embodiment, the source may be centrally positioned such that a larger percentage, or all, of the photosensitive detector cells are positioned perpendicular to the incoming x-rays. The array 12 of individual photosensitive cells (pixels) 22 may be electronically addressed (scanned) by their position according to column and row. As used herein, the terms "column" and "row" refer to the vertical and horizontal arrangement of the photosensor cells 22 and, for clarity of description, it will be assumed that the rows extend horizontally and the columns extend vertically. However, the orientation of the columns and rows is arbitrary and does not limit the scope of any embodiments disclosed herein. Furthermore, the term "subject" may be illustrated as a human patient in the description of FIG. 1, however, a subject of a DR imaging system, as the term is used herein, may be a human, an animal, an inanimate object, or a portion thereof.

In one exemplary embodiment, the rows of photosensitive cells 22 may be scanned one or more at a time by electronic scanning circuit 28 so that the exposure data from the array 12 may be transmitted to electronic read-out circuit 30. Each photosensitive cell 22 may independently store a charge proportional to an intensity, or energy level, of the attenuated radiographic radiation, or x-rays, received and absorbed in the cell. Thus, each photosensitive cell, when read-out, provides information defining a pixel of a radiographic image 24, e.g. a brightness level or an amount of energy absorbed by the pixel, that may be digitally decoded by image processing electronics 34 and transmitted to be displayed by the digital monitor 26 for viewing by a user. An electronic bias circuit 32 is electrically connected to the two-dimensional detector array 12 to provide a bias voltage to each of the photosensitive cells 22.

Each of the bias circuit 32, the scanning circuit 28, and the read-out circuit 30, may communicate with an acquisition control and image processing unit 34 over a connected cable (wired), or the DR detector may be equipped with a wireless transmitter to transmit radiographic image data wirelessly to the acquisition control and image processing unit 34. The acquisition control and image processing unit 34 may include a processor and electronic memory (not shown) to control operations of the DR detector 40 as described herein, including control of circuits 28, 30, and 32, for example, by use of programmed instructions. The acquisition control and image processing unit 34 may also be used to control activation of the x-ray source 14 during a radiographic exposure, controlling an x-ray tube electric current magnitude, and thus the fluence of x-rays in x-ray beam 16, and/or the x-ray tube voltage, and thus the energy level of the x-rays in x-ray beam 16.

The acquisition control and image processing unit 34 may transmit image (pixel) data to the monitor 26, based on the radiographic exposure data received from the array 12 of photosensitive cells 22. Alternatively, acquisition control and image processing unit 34 can process the image data and store it, or it may store raw unprocessed image data, in local or remotely accessible memory.

With regard to a direct detection embodiment of DR detector 40, the photosensitive cells 22 may each include a sensing element sensitive to x-rays, i.e. it absorbs x-rays and generates an amount of charge carriers in proportion to a magnitude of the absorbed x-ray energy. A switching element may be configured to be selectively activated to read out the charge level of a corresponding x-ray sensing element. With regard to an indirect detection embodiment of DR detector 40, photosensitive cells 22 may each include a sensing element sensitive to light rays in the visible spectrum, i.e. it absorbs light rays and generates an amount of charge carriers in proportion to a magnitude of the absorbed light energy, and a switching element that is selectively activated to read the charge level of the corresponding sensing element. A scintillator, or wavelength converter, may be disposed over the light sensitive sensing elements to convert incident x-ray radiographic energy to visible light energy. Thus, in the embodiments disclosed herein, it should be noted that the DR detector 40 (or DR detector 300 in FIG. 3 or DR detector 400 in FIG. 4) may include an indirect or direct type of DR detector.

Examples of sensing elements used in sensing array 12 include various types of photoelectric conversion devices (e.g., photosensors) such as photodiodes (P-N or PIN diodes), photo-capacitors (MIS), photo-transistors or photoconductors. Examples of switching elements used for signal read-out include a-Si TFTs, oxide TFTs, MOS transistors, bipolar transistors and other p-n junction components.

Figure 2:
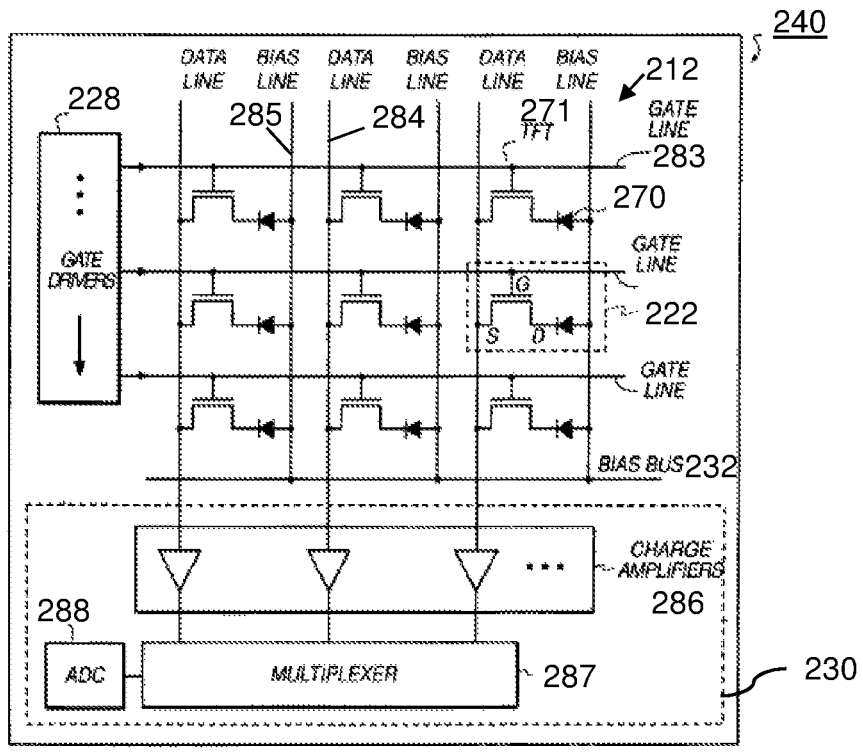
FIG. 2 is a schematic diagram of an exemplary photosensor array in a digital radiographic (DR) detector.

FIG. 2 is a schematic diagram 240 of a portion of a two-dimensional array 12 for a DR detector 40. The array of photosensor cells 212, whose operation may be consistent with the photosensor array 12 described above, may include a number of hydrogenated amorphous silicon (a-Si:H) n-i-p photodiodes 270 and thin film transistors (TFTs) 271 formed as field effect transistors (FETs) each having gate (G), source (S), and drain (D) terminals. In embodiments of DR detector 40 disclosed herein, such as a multilayer DR detector (400 of FIG. 4), the two-dimensional array of photosensor cells 12 may be formed in a device layer that abuts adjacent layers of the DR detector structure, which adjacent layers may include a rigid glass layer or a flexible polyimide layer without any adjacent rigid layers. A plurality of gate driver circuits 228 may be electrically connected to a plurality of gate lines 283 which control a voltage applied to the gates of TFTs 271, a plurality of readout circuits 230 may be electrically connected to data lines 284, and a plurality of bias lines 285 may be electrically connected to a bias line bus or a variable bias reference voltage line 232 which controls a voltage applied to the photodiodes 270. Charge amplifiers 286 may be electrically connected to the data lines 284 to receive signals therefrom. Outputs from the charge amplifiers 286 may be electrically connected to a multiplexer 287, such as an analog multiplexer, then to an analog-to-digital converter (ADC) 288, or they may be directly connected to the ADC, to stream out the digital radiographic image data at desired rates. In one embodiment, the schematic diagram of FIG. 2 may represent a portion of a DR detector 40 such as an a-Si:H based indirect flat or curved panel imager.

Incident x-rays, or x-ray photons, 16 are converted to optical photons, or light rays, by a scintillator, which light rays are subsequently converted to electron-hole pairs, or charges, upon impacting the a-Si:H n-i-p photodiodes 270. In one embodiment, an exemplary detector cell 222, which may be equivalently referred to herein as a pixel, may include a photodiode 270 having its anode electrically connected to a bias line 285 and its cathode electrically connected to the drain (D) of TFT 271. The bias reference voltage line 232 can control a bias voltage of the photodiodes 270 at each of the detector cells 222. The charge capacity of each of the photodiodes 270 is a function of its bias voltage and its capacitance. In general, a reverse bias voltage, e.g. a negative voltage, may be applied to the bias lines 285 to create an electric field (and hence a depletion region) across the pn junction of each of the photodiodes 270 to enhance its collection efficiency for the charges generated by incident light rays. The image signal represented by the array of photosensor cells 212 may be integrated by the photodiodes while their associated TFTs 271 are held in a non-conducting (off) state, for example, by maintaining the gate lines 283 at a negative voltage via the gate driver circuits 228. The photosensor cell array 212 may be read out by sequentially switching rows of the TFTs 271 to a conducting (on) state by means of the gate driver circuits 228. When a row of the pixels 22 is switched to a conducting state, for example by applying a positive voltage to the corresponding gate line 283, collected charge from the photodiode in those pixels may be transferred along data lines 284 and integrated by the external charge amplifier circuits 286. The row may then be switched back to a non-conducting state, and the process is repeated for each row until the entire array of photosensor cells 212 has been read out. The integrated signal outputs are transferred from the external charge amplifiers 286 to an analog-to-digital converter (ADC) 288 using a parallel-to-serial converter, such as multiplexer 287, which together comprise read-out circuit 230.

This digital image information may be subsequently processed by image processing system 34 to yield a digital image which may then be digitally stored and immediately displayed on monitor 26, or it may be displayed at a later time by accessing the digital electronic memory containing the stored image. The flat panel DR detector 40 having an imaging array as described with reference to FIG. 2 is capable of both single-shot (e.g., static, radiographic) and continuous (e.g., fluoroscopic) image acquisition.

Figure 3:
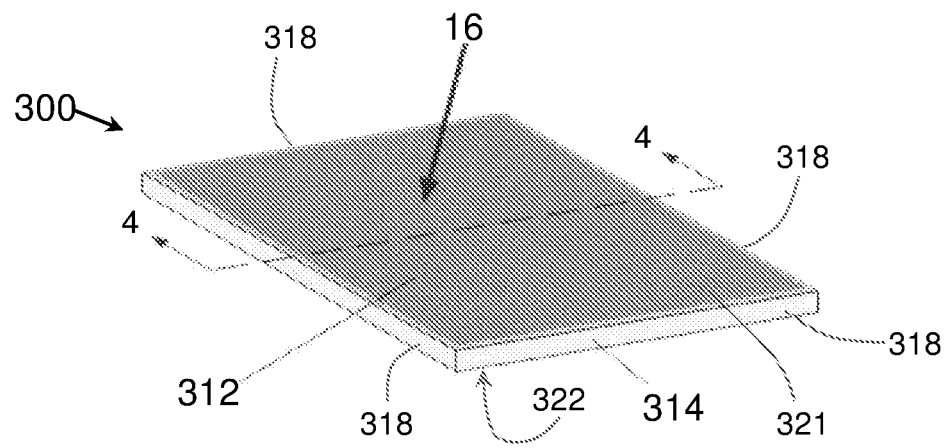
FIG. 3 is a diagram of a DR detector.

FIG. 3 shows a perspective view of an exemplary prior art generally rectangular, planar, portable wireless DR detector 300 according to an embodiment of DR detector 40 disclosed herein. The DR detector 300 may include a flexible substrate to allow the DR detector to capture radiographic images in a curved orientation. The flexible substrate may be fabricated in a permanent curved orientation, or it may remain flexible throughout its life to provide an adjustable curvature in two or three dimensions, as desired. The DR detector 300 may include a similarly flexible housing portion 314 that surrounds a multilayer structure comprising a flexible photosensor array portion 22 of the DR detector 300. The housing portion 314 of the DR detector 300 may include a continuous, rigid or flexible, x-ray opaque material or, as used synonymously herein a radio-opaque material, surrounding an interior volume of the DR detector 300. The housing portion 314 may include four flexible edges 318, extending between the top side 321 and the bottom side 322, and arranged substantially orthogonally in relation to the top and bottom sides 321, 322. The bottom side 322 may be continuous with the four edges and disposed opposite the top side 321 of the DR detector 300. The top side 321 comprises a top cover 312 attached to the housing portion 314 which, together with the housing portion 314, substantially encloses the multilayer structure in the interior volume of the DR detector 300. The top cover 312 may be attached to the housing 314 to form a seal therebetween, and be made of a material that passes x-rays 16 without significant attenuation thereof, i.e., an x-ray transmissive material or, as used synonymously herein, a radiolucent material, such as a carbon fiber plastic, polymeric, or other plastic based material.

Figure 4:
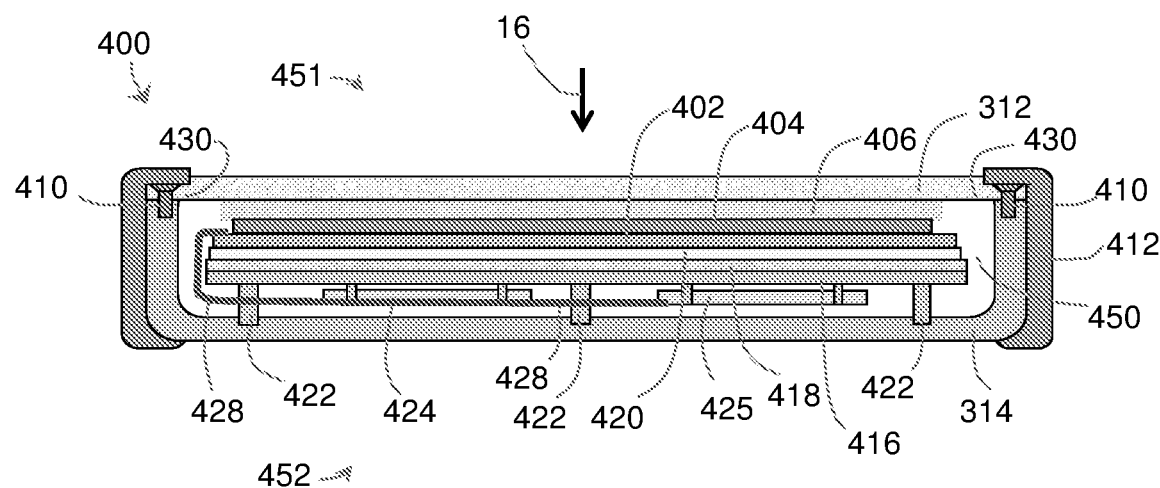
FIG. 4 is a cross-section view of the DR detector of FIG. 3.

With reference to FIG. 4, there is illustrated in schematic form an exemplary cross-section view along section 4-4 of the exemplary embodiment of the DR detector 300 (FIG. 3). For spatial reference purposes, one major surface of the DR detector 400 may be referred to as the top side 451 and a second major surface may be referred to as the bottom side 452, as used herein. The multilayer structure may be disposed within the interior volume 450 enclosed by the housing 314 and top cover 312 and may include a flexible curved or planar scintillator layer 404 over a curved or planar the two-dimensional imaging sensor array 12 shown schematically as the device layer 402. The scintillator layer 404 may be directly under (e.g., directly connected to) the substantially planar top cover 312, and the imaging array 402 may be directly under the scintillator 404. Alternatively, a flexible layer 406 may be positioned between the scintillator layer 404 and the top cover 312 as part of the multilayer structure to allow adjustable curvature of the multilayer structure and/or to provide shock absorption. The flexible layer 406 may be selected to provide an amount of flexible support for both the top cover 312 and the scintillator 404, and may comprise a foam rubber type of material. The layers just described comprising the multilayer structure each may generally be formed in a rectangular shape and defined by edges arranged orthogonally and disposed in parallel with an interior side of the edges 318 of the housing 314, as described in reference to FIG. 3.

A substrate layer 420 may be disposed under the imaging array 402, such as a rigid glass layer, in one embodiment, or flexible substrate such as polyimide upon which the array of photosensors 402 may be formed to allow adjustable curvature of the array, and may comprise another layer of the multilayer structure. Under the substrate layer 420 a radio-opaque shield layer 418 may be used as an x-ray blocking layer to help prevent scattering of x-rays passing through the substrate layer 420 as well as to block x-rays reflected from other surfaces in the interior volume 450. Readout electronics, including the scanning circuit 28, the read-out circuit 30, and the bias circuit 32 (all of FIG. 1) may be formed adjacent the imaging array 402 or, as shown, may be disposed below frame support member 416 in the form of integrated circuits (ICs) electrically connected to printed circuit boards 424, 425. The imaging array 402 is electrically connected to the readout electronics 424 (ICs) over a flexible connector 428 which may comprise a plurality of flexible, sealed conductors known as chip-on-film (COF) connectors, which structure and method of connection is described herein.

X-ray flux may pass through the radiolucent top panel cover 312, in the direction represented by an exemplary x-ray beam 16, and impinge upon scintillator 404 where stimulation by the high-energy x-rays 16, or photons, causes the scintillator 404 to emit lower energy photons as visible light rays which are then received in the photosensors of imaging array 402. The frame support member 416 may connect the multilayer structure to the housing 314 and may further operate as a shock absorber by disposing elastic pads (not shown) between the frame support beams 422 and the housing 314. Fasteners 410 may be used to attach the top cover 312 to the housing 314 and create a seal therebetween in the region 430 where they come into contact. In one embodiment, an external bumper 412 may be attached along the edges 318 of the DR detector 400 to provide additional shock-absorption.

Figure 5A:
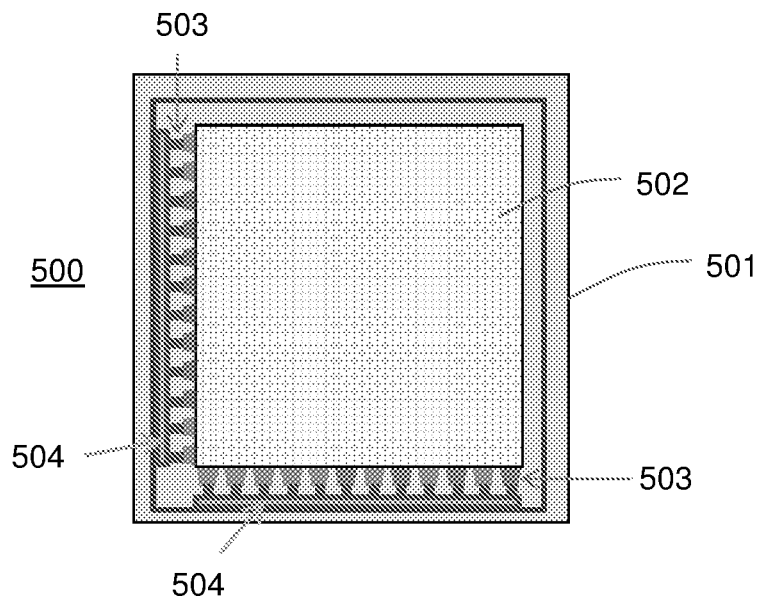
FIG. 5A is a schematic diagram of an exemplary image sensor panel fabricated on a glass substrate, and usable in a DR detector, with an ESD protection circuit and shorting bar.
Figure 5B:
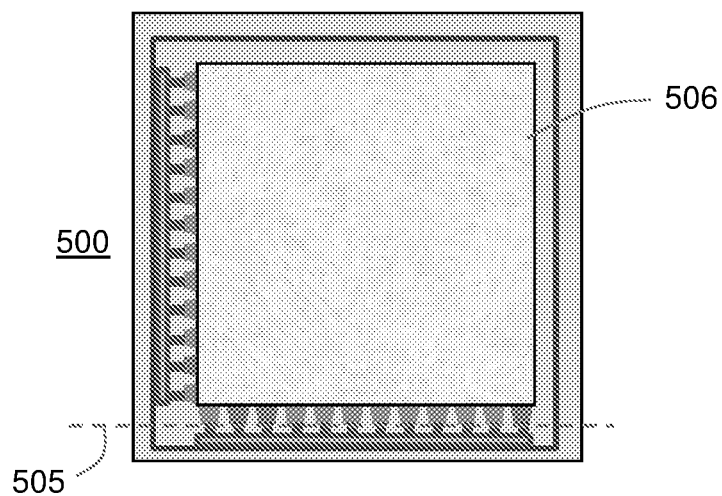
FIG. 5B is a schematic diagram of an exemplary scintillator layer deposited or laminated on the sensor array of the exemplary image sensor panel of FIG. 5A.
Figure 5C:
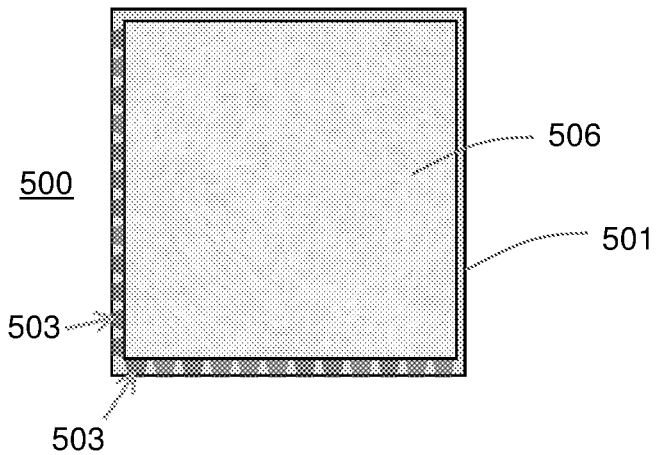
FIG. 5C is a schematic diagram of the exemplary image sensor panel of FIG. 5B with the ESD protection circuit removed, the substrate glass cut to a desired size, and the TAB pads ready for electrical connection.
Figure 5D:
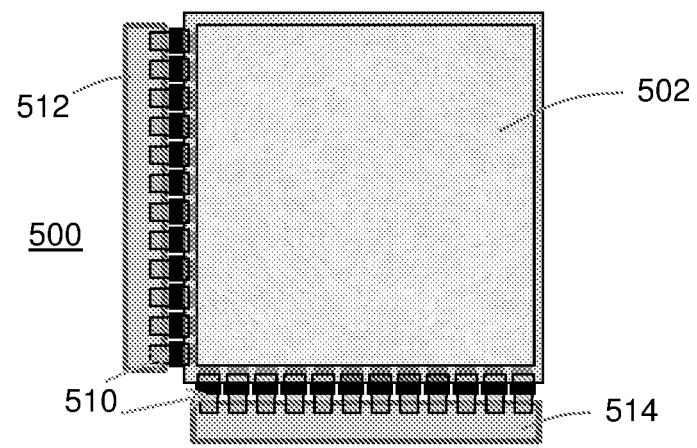
FIG. 5D is a schematic diagram of the exemplary image sensor panel of FIG. 5C with PCB or PWB boards, such as row address electronics and image read out electronics, electrically connected to the TAB pads using COFs.

FIGS. 5A-D illustrate exemplary manufacturing steps using a rigid glass substrate in a prior art image sensor array panel 500. A brief description of the prior art process will be described to assist in understanding the novel methods and apparatuses disclosed herein, which address methods of introducing flexible substrate based image sensors into a glass based manufacturing process. FIG. 5A shows a glass substrate 501 supporting a two dimensional image sensor array 502 formed thereon. A series of bond pads 503 are formed along one or two edges of the array 502 and are electrically connected to the photosensitive imaging cells of the array 502. Electrostatic discharge (ESD) protection circuits 503 are formed alongside the bond pads to electrically connect (short) the bonds pads 503 together during manufacture, and are removed at a later step. In one example, the ESD protection circuits 503 may be in place during probe testing of the image sensor array panel. FIG. 5B shows an exemplary scintillator 506 formed over the image sensor array 502, such as by being deposited or laminated thereon. FIG. 5C shows the image sensor array panel 500 after the ESD protection circuit 504 is removed, such as by cutting through the conductors of the ESD protection circuit 504 and through the glass substrate along one or more exemplary linear cut lines 505 (FIG. 5B). The glass substrate 501 may be cut to a desired size. FIG. 5D shows the prior art image sensor array panel 500 having gate array drivers 512 and photosensor read out electronic circuits 514 electrically connected to the bond pads 503 using chip-on-film flexible connectors 510. In a final assembly, the row driver electronics 512 and photosensor read out electronic circuits 514 may be folded under the sensor array 502 region, such as described herein with reference to FIG. 4, and placed within a suitable housing to form a digital radiographic detector.

Figure 6A:
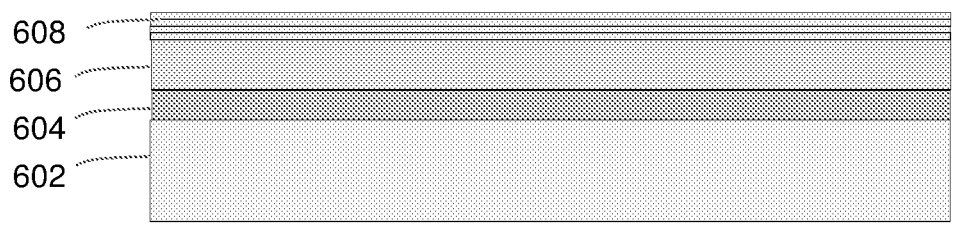
FIG. 6A is a schematic cross-section of exemplary including a release layer, polyimide layer, buffer layer, and glass carrier in an exemplary image sensor panel during fabrication.
Figure 6B:
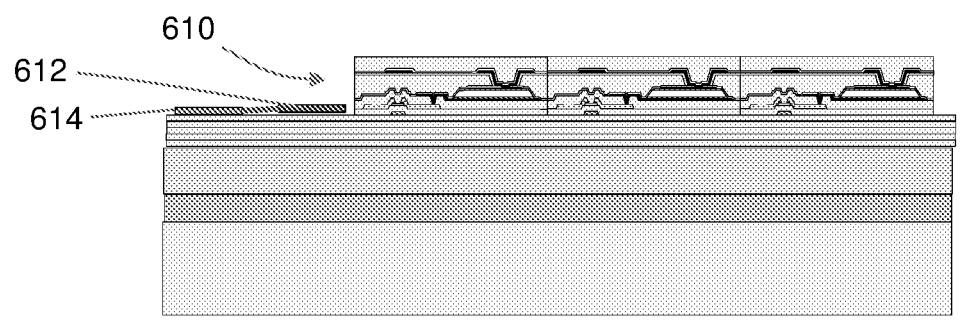
FIG. 6B is a schematic cross-section of the layers of FIG. 6A further including an image sensor array with an ESD protection circuit and TAB pads fabricated onto the polyimide-buffer layer.
Figure 6C:
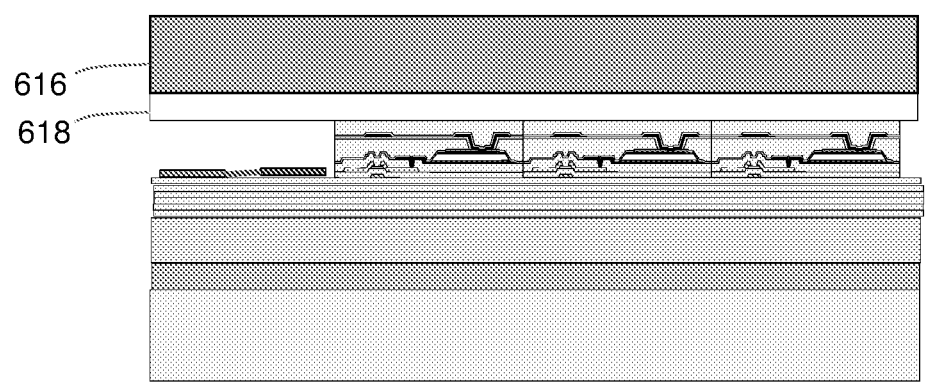
FIG. 6C is a schematic cross-section of the layers of FIG. 6B further including a temporary holding fixture, or substrate, attached thereto using a temporary adhesive.
Figure 6D:
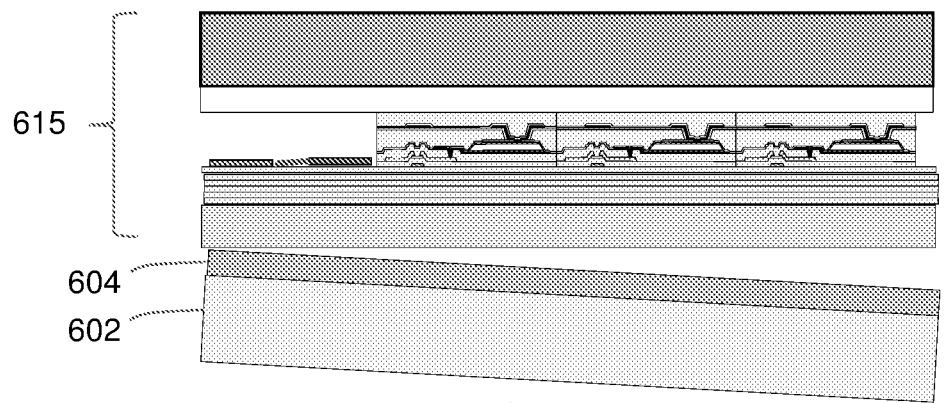
FIG. 6D is a schematic cross-section of the layers of FIG. 6C illustrating an exemplary release of the glass substrate from the PI layer using laser exposure or mechanical peeling.
Figure 6E:
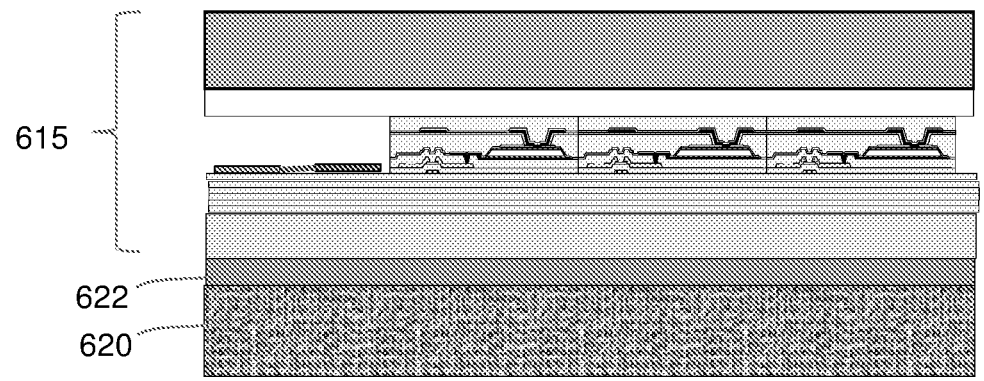
FIG. 6E is a schematic cross-section of the layers of FIG. 6D attached, or laminated, to an exemplary secondary substrate using an adhesive layer.
Figure 6F:
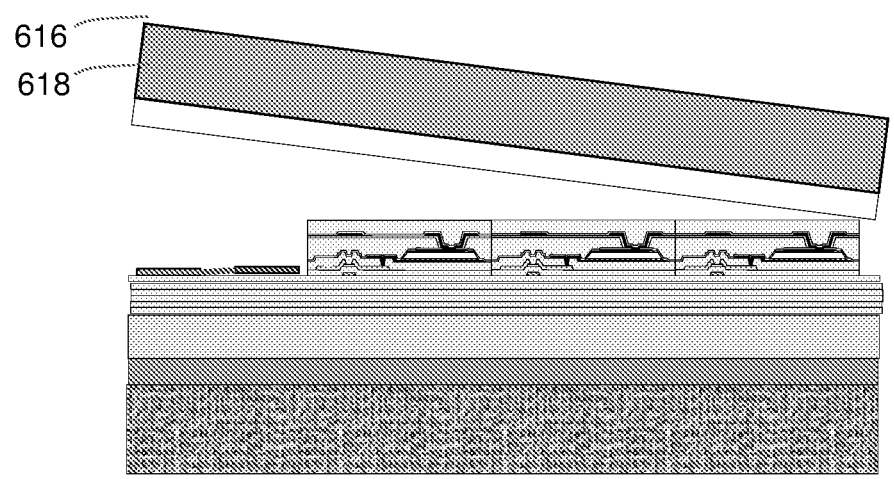
FIG. 6F is a schematic cross-section of the layers of FIG. 6E illustrating an exemplary removal of the temporary holding fixture.
Figure 6G:
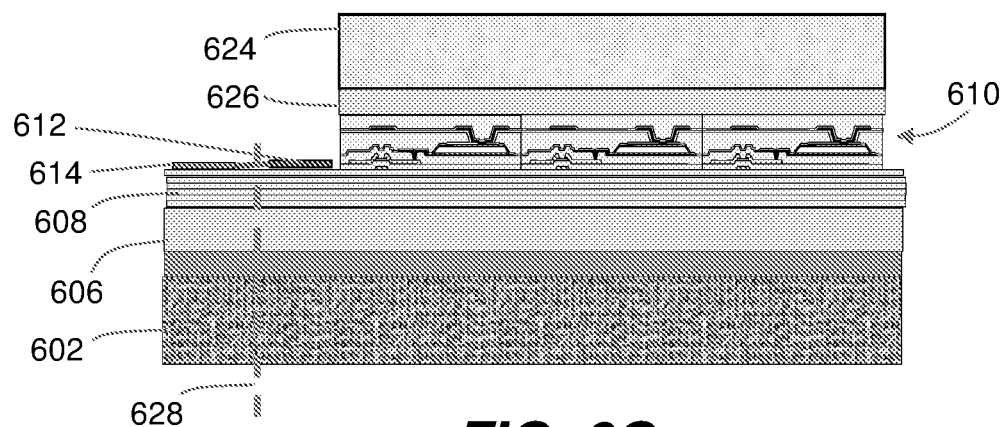
FIG. 6G is a schematic cross-section of the layers of FIG. 6F having a scintillator layer deposited or laminated onto the array buffer layer using an optically clear adhesive, the ESD circuit removed along cut line $$, and the substrate cut to a desired size along a cut line.
Figure 6H:
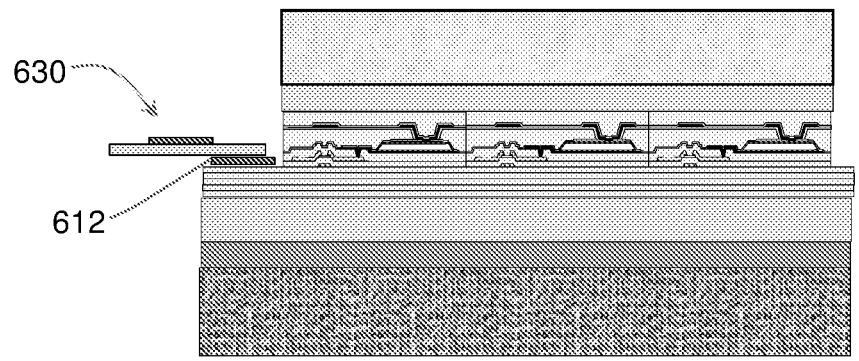
FIG. 6H is a schematic cross-section of the layers of FIG. 6G further including attaching the read out electronics to the TAB pads using COFs.

FIGS. 6A-H show cross-section views of an exemplary image sensor and methods of fabrication. With reference to FIG. 6A, a glass substrate 602 has a release layer 604 formed thereon; a high temperature polyimide layer 606 is formed on the release layer 604; and one or more buffer layers 608 are formed on the polyimide layer 606. The buffer layer 608 may be a flexible sealant layer made of a silicon oxide, silicon nitride, or a combination thereof. As shown in FIG. 6B, an image sensor array 610, bond pads 612, and ESD protection circuits 614 are formed on the buffer layer 608. As shown in FIG. 6C, a temporary holding substrate 616 is attached to the image sensor array assembly using a temporary adhesive 618. As shown in FIG. 6D, the glass substrate 602 is released from the image sensor assembly 615 along the release layer 604. The glass substrate may be removed using a mechanical peel process or by other methods, such as by using a release layer 604 activated by exposure to a directed light beams. As shown in FIG. 6E, the image sensor assembly 615 is reattached, or relaminated, to a secondary substrate 620 using an adhesive 622 and, as shown in FIG. 6F, the temporary substrate 616 and temporary adhesive 618 are removed. As shown in FIG. 6G, a scintillator 624 is attached to the imaging array 610 using an optically clear adhesive, for example, or the scintillator 624 may be directly deposited on the imaging array 610. The ESD protection circuits 614 are cut off along cut line 628, which cut line 628 extends through the layers supporting the ESD protection circuits 614, such as the buffer layer 608, polyimide layer 606, and the secondary substrate 602. FIG. 6H shows the electrical connection of the bond pads 612 to the COFs 630 which, in turn, are electrically connected to the read out electronics (not shown).

Figure 7A:
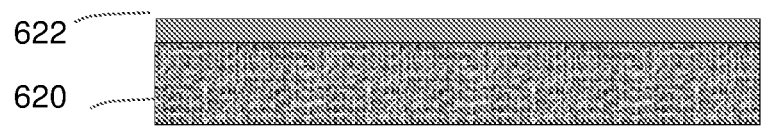
FIGS. 7A-7D are schematic diagrams of interchangeable combinations of a secondary substrate and other layers: an exemplary secondary substrate with an adhesive layer (7A); the exemplary secondary substrate with adhesive layer and an exemplary planarized layer with adhesive layer (7B); a secondary substrate with an adhesive layer and an x-ray backscatter shield layer laminated thereto and/or high x-ray attenuation materials included in the secondary substrate (7C); and a secondary substrate with an adhesive layer and electrically conductive layers having adhesive layers thereon (7D)
Figure 7B:
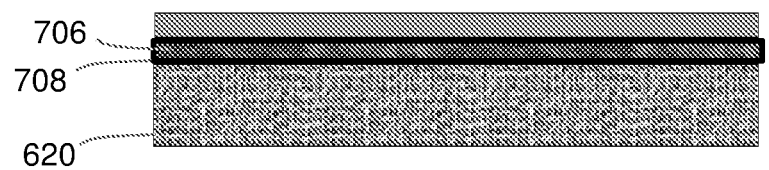
Figure 7C:
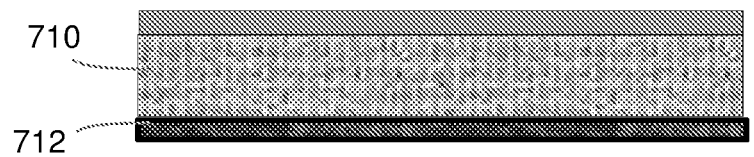
Figure 7D:
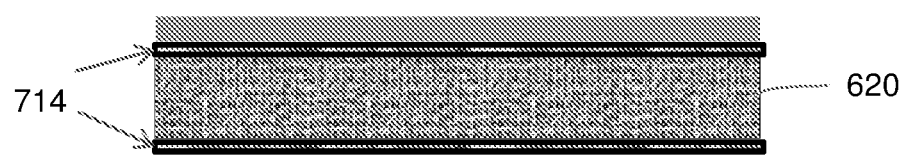

FIGS. 7A-D are schematic diagrams of exemplary alternative secondary substrates that may be interchangeably used in the assembly methods described herein. FIG. 7A shows the secondary substrate 620 and adhesive layer 622 described in the process steps of FIGS. 6E-H. FIG. 7B illustrates an alternative secondary substrate including an intermediate layer formed from a planarization layer 706 having adhesive 708 thereon. The planarization layer 706 may be formed on the substrate 620 in a planar form, or it may be planarized, using known methods, after formation on the substrate layer 620. FIG. 7C illustrates an alternative secondary substrate including a substrate layer 710 having high x-ray attenuating material interspersed, embedded, or otherwise combined into the substrate layer 710. A backscatter shield layer 712 may be used in combination with the secondary substrate 710 or 620. FIG. 7D illustrates an alternative secondary substrate including one or more electrically conductive layers 714 placed on one or both top and bottom sides of the secondary substrate layer 620.

Figure 8A:
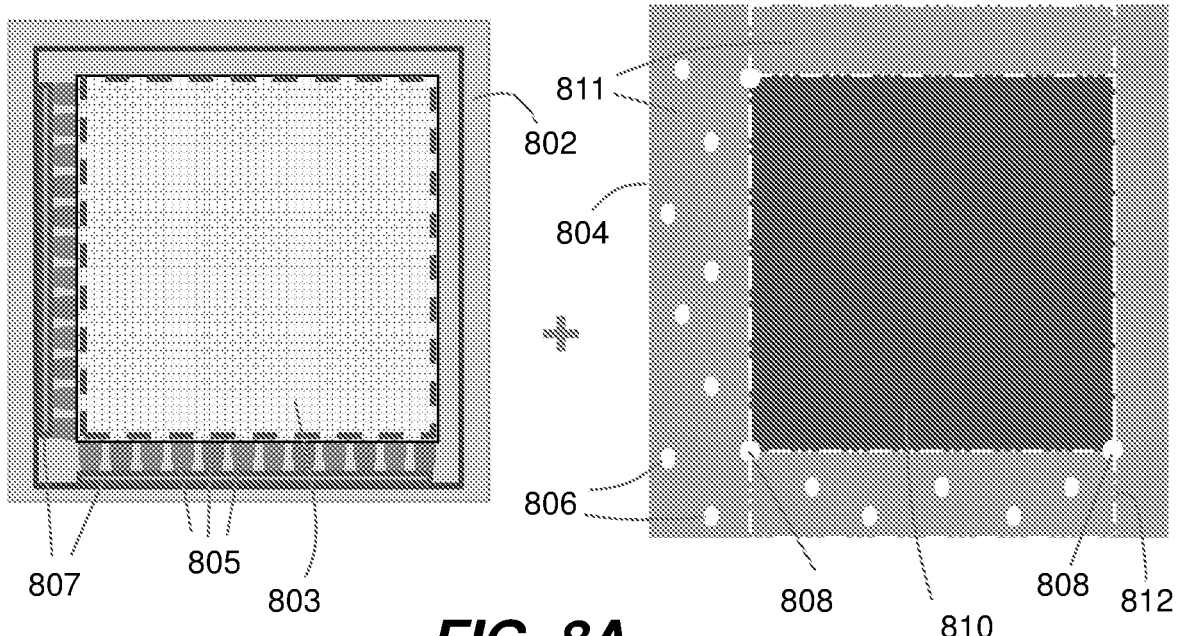
FIGS. 8A-8H illustrate method steps for fabricating a flexible substrate image sensor panel wherein bond pads extend from the substrates.
Figure 8B:
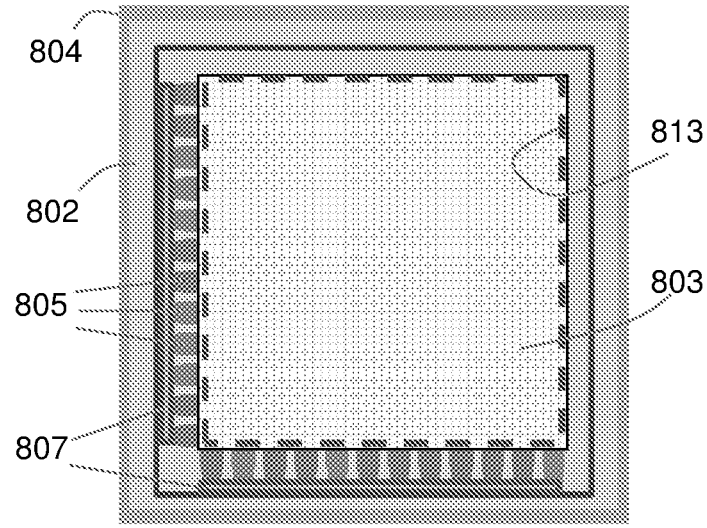
Figure 8C:
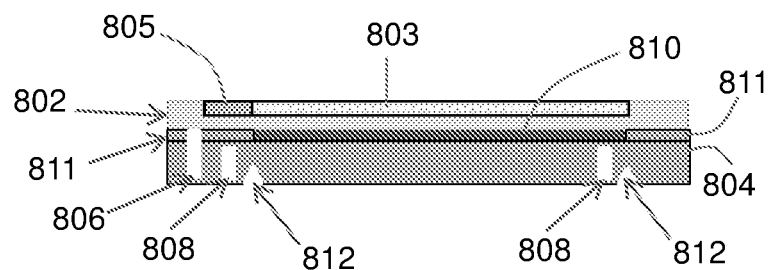

FIGS. 8A-H illustrate a process for fabricating an image sensor panel, which panel may be incorporated into a DR detector. The left side of FIG. 8A illustrates an image sensor array panel formed on a glass substrate similar in certain respects to the glass substrate image sensor array panel 500. In one embodiment, the glass substrate may include a coating of polyimide 802, whereon the sensor array 803, bond pads 805 and ESD protection circuits 807 are formed. The right side of FIG. 8A illustrates a secondary substrate 804. The secondary substrate 804 is used to replace the glass substrate using the same methods as described herein with reference to at least FIG. 6B through FIG. 6F. The resulting assembly is shown in FIG. 8B, with cross-section in FIG. 8C, wherein the image sensor array 803 is formed on a polyimide layer 802 is attached to the secondary substrate 804. The secondary substrate 804, as shown, includes several advantageous features. The secondary substrate 804 may include vacuum ports 806 to secure a polyimide layer 802 thereon via a vacuum applied to the vacuum ports 806 to secure the polyimide layer 802 thereon via suction, rather than using an adhesive. The secondary substrate 804 may include camera illumination ports 808 whereby a light source may be positioned underneath the secondary substrate 804 and used to illuminate features of the imaging array 803, such as the bond pads 805 or at corners of the image array 803, when viewing the image array 803 from the top to enable bond pad attachment to COF contact pads using a camera and monitor. The illumination may also be used for alignment of probe tester contacts to the bond pads. The illumination ports 808 may be formed as openings 808 partially through the secondary substrate 804 or pockets within the secondary substrate 804 to reduce an aggregate thickness of the secondary substrate 804 to allow light to more easily pass through the secondary substrate 804 from the bottom side through to the top side for easier viewing and visibility of the array features from the top side of the secondary substrate 804 when using a camera and monitor. In one embodiment, fiducial marks are placed on the polyimide layer 802 to be more easily identified via the illumination. In one embodiment, the secondary substrate may include camera illumination ports 808 at a plurality of desired locations.

The secondary substrate 804 may include scribed or perforated break lines 812 to permit easier removal of peripheral regions of the secondary substrate 804 by cracking, breaking, or cutting the secondary substrate 804 along the break lines 812. Typically, the scribed or perforated break lines 812 are used after the ESD protection circuits 807 are removed by cutting them off, for example, as described herein. In one embodiment, the break lines 812 are formed so that the portion of the secondary substrate 804 that remains after breaking, or cutting, and removing portions thereof is the portion directly beneath the imaging array 803, as shown by the dashed line 813 in FIG. 8B, which corresponds to the break lines 812. The secondary substrate 804 may be patterned with different adhesives applied thereon to make contact with, and secure by adhesion, the polyimide layer 802. A first adhesive 810 may be applied to an area of the secondary substrate 804 directly beneath the area of the imaging array 803 when the polyimide layer 802 is attached to the secondary substrate 804. One or more edges of the first adhesive 810 may be coextensive with the break line 812 of the secondary substrate 804 to form a continuous surface therebetween as shown in the view of FIG. 8F. A second adhesive 811 may be applied to the secondary substrate 804 in regions outside the area of the imaging array 803, i.e., in peripheral regions of the secondary substrate 804. The second adhesive may be selected to have a lower tack (less adhesion), to have a lower thermal tolerance, to be releasable under UV light exposure, to be releasable under laser exposure, to be releasable under thermal exposure, or a combination thereof, in selected areas of the secondary substrate 804 outside the region of the sensor array 803. In one embodiment, selected areas of the secondary substrate 804 outside the region of the sensor array 803 do not have an adhesive thereon, as desired.

Figure 8D:
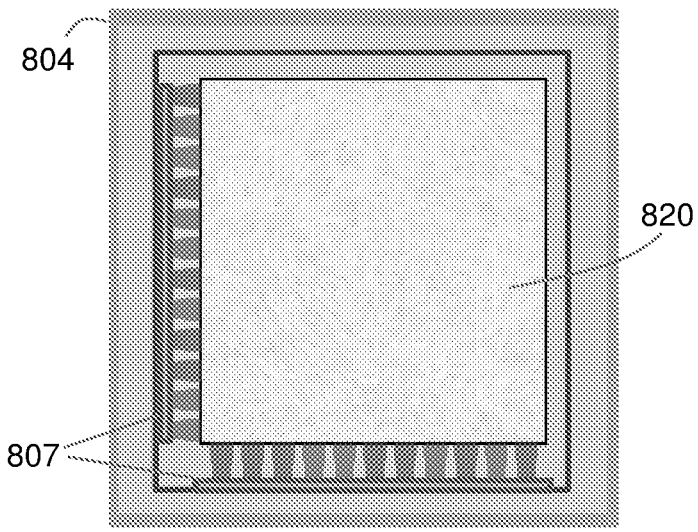
Figure 8E:
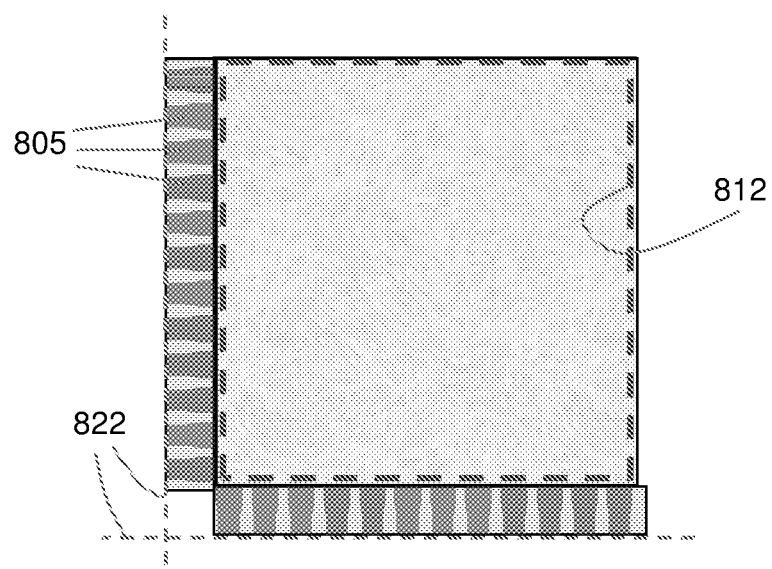
Figure 8F:
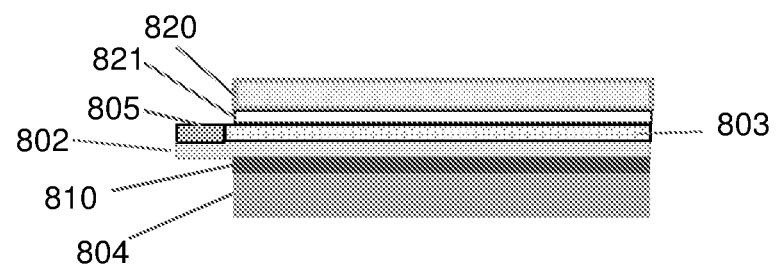
Figure 8G:
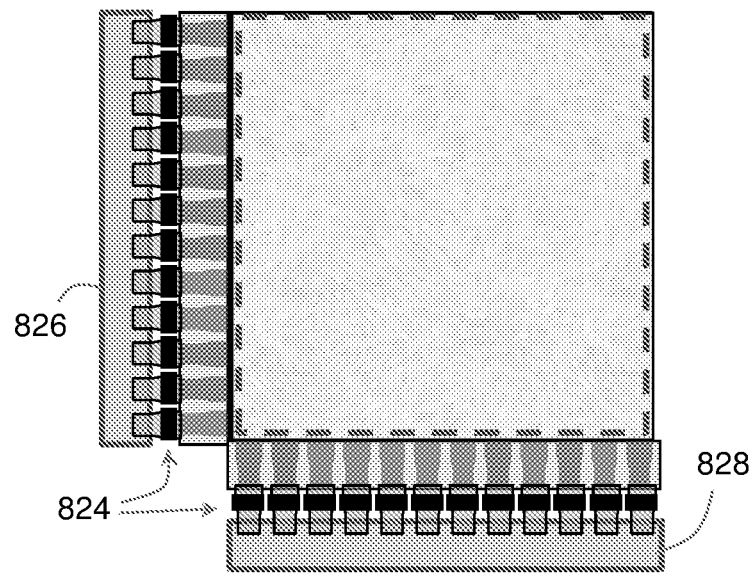
Figure 8H:
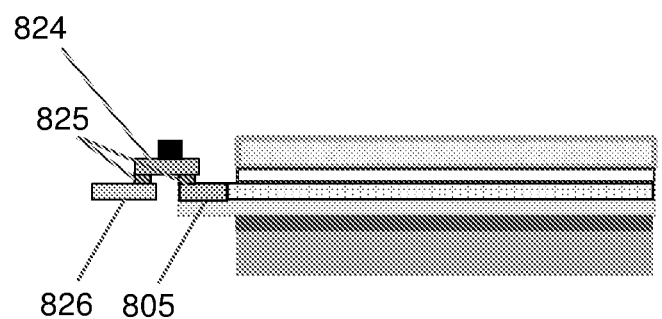

FIG. 8D shows the scintillator 820 over the imaging array 803 after it's laminated or deposited thereon. In one embodiment, an optically clear adhesive 821 (FIG. 8F) may be used to attach the scintillator 820 onto the imaging array 803. FIG. 8E, and cross-section FIG. 8F, show the result of a singulation process whereby the secondary substrate 804 is removed along break lines 812 and the ESD protection circuits 807 are cut off along cut lines 822. Either step, removal of substrate periphery or ESD circuits, may be performed first. In this embodiment, the break lines 812 and the cut lines 822 are not aligned with each other in a vertical direction (perpendicular to a plane of the image array 803) which provides a feature of the disclosed process whereby the bond pads 805 extend beyond an (broken) edge of the secondary substrate 804 after the peripheral regions of the secondary substrate 804 are removed (broken) along the break lines 812, as can be seen in the cross-section view of FIG. 8F. In one embodiment, if an adhesive is used on the peripheral regions of the secondary substrate 804, the polyimide layer 802 beneath the bond pads 805 is detached from the secondary substrate 804 before breaking or cutting the peripheral regions of the secondary substrate 804 along the break lines 812. FIG. 8G, and cross-section FIG. 8H, show the resulting module assembly after COFs 824 are electrically attached to the bond pads 805 and array control electronics such as by using a TAB process. The control electronics may include row drivers 826 and read out circuits 828. In one embodiment, anisotropic conductive films 825 may be used to attach the COFs 824 to respective bond pads 805 and electrical contact areas on the array control electronics. The anisotropic conductive film 825 may be used to connect the bond, or TAB, pads to the contact pads of the COF under heat and pressure, and can also be used to connect the COF contact pads to the PCBs of the row drivers 826 and read out circuits 828 of the control electronics.

Figure 9A:
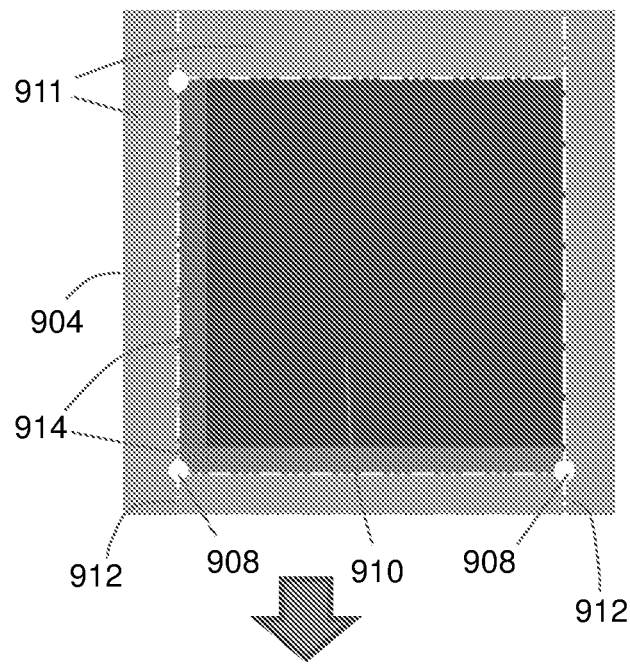
FIGS. 9A-9G illustrate method steps for fabricating a flexible substrate image sensor panel wherein bond pads do not extend from the substrates and are supported by a secondary substrate.
Figure 9B:
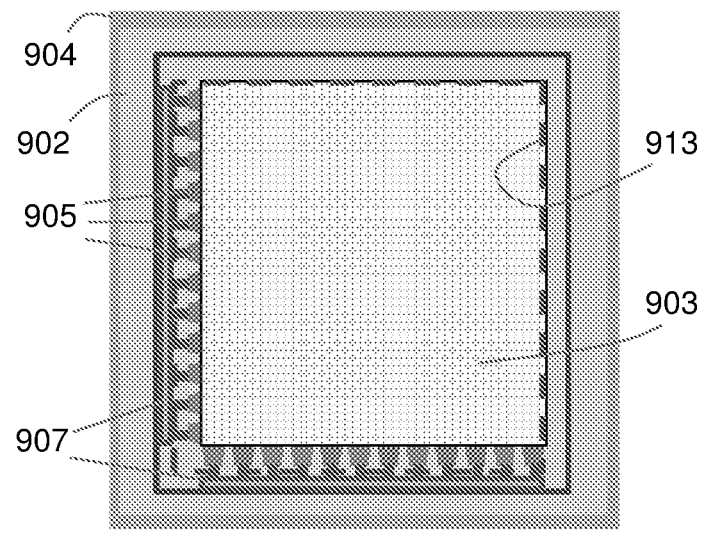
Figure 9C:
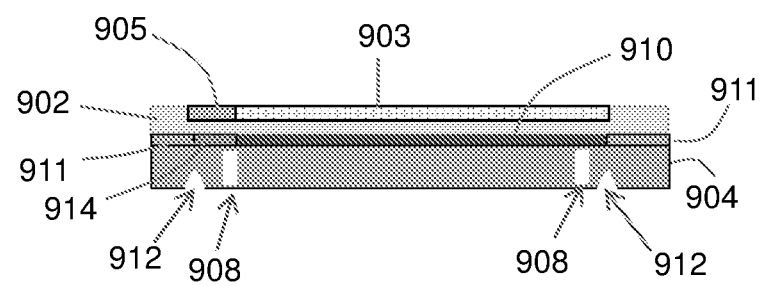

FIGS. 9A-G illustrate another embodiment for fabricating an image sensor panel, which panel may be incorporated into a DR detector. FIG. 9A illustrates an embodiment of a secondary substrate 904 that may be used with the image sensor array panel formed on a glass substrate as shown in FIG. 8A. The glass substrate may include a polyimide layer on the glass substrate, whereon the sensor array, bond pads and ESD protection circuits are formed. The secondary substrate 904 is used to replace the glass substrate using the same methods as described herein with reference to at least FIG. 6B through FIG. 6F. The resulting assembly is shown in FIG. 9B, with cross-section in FIG. 9C, wherein the image sensor array 903, bond pads 905, and ESD protection circuits 907, are formed on a polyimide layer 902 now attached to the secondary substrate 904 which replaces the glass substrate. The secondary substrate 904, as shown, includes several advantageous features. Although the secondary substrate 904 will de described herein with reference to new feature embodiments, the same features of secondary substrate 804 may be included in the secondary substrate 904 and used in the processes of FIGS. 9A-G. Thus, the secondary substrate 904 may include: vacuum ports 806 to secure a polyimide layer 902 as described herein; camera illumination ports 908 which are configured in the same manner as camera illumination ports 808 whereby a light source may be positioned underneath the secondary substrate 904 and used to illuminate features of the imaging array 903 as described herein; and fiducial marks may be placed on the polyimide layer 902 to be more easily identified via the illumination;

The secondary substrate 904 may include scribed or perforated break lines 912 to permit easier removal of peripheral regions of the secondary substrate 904 by cracking, breaking, or cutting the secondary substrate 904 along the break lines 912. Typically, the scribed or perforated break lines 912 are used after the ESD protection circuits 907 are removed by cutting them off, for example, as described herein. In one embodiment, the break lines 912 are formed so that the portion of the secondary substrate 904 that remains after breaking, or cutting, and removing portions thereof is the portion directly beneath the imaging array 903 and beneath the bond pads 905, as shown by the dashed line 913 in FIG. 9B, which corresponds to the break lines 912. The secondary substrate 904 may be patterned with different adhesives applied thereon to make contact with, and secure by adhesion, the polyimide layer 902. A first adhesive 910 may be applied to an area of the secondary substrate 904 directly beneath the area of the imaging array 903 when the polyimide layer 902 is attached to the secondary substrate 904. One or more edges of the first adhesive 910 may be coextensive with one or more edges of the imaging array 903. A second adhesive 911 may be applied to the secondary substrate 904 in peripheral regions outside the area of the imaging array 903, i.e., in peripheral regions of the secondary substrate 904. The second adhesive may be selected to have a lower tack (less adhesion), to have a lower thermal tolerance, to be releasable under UV light exposure, to be releasable under laser exposure, to be releasable under thermal exposure, or a combination thereof, in selected areas of the secondary substrate 904 outside the region of the sensor array 903. In one embodiment, selected peripheral areas of the secondary substrate 904 outside the region of the sensor array 903 do not have an adhesive thereon, as desired.

In one embodiment, the secondary substrate 904 may include a solidified portion 914 having greater compressive strength than other portions of the secondary substrate 904. The solidified portion 914 may be positioned directly beneath the bond pads 905 to provide additional support and tolerance under a high temperature and pressure TAB attach process when COFs 924 (FIG. 9F) are attached to the bond pads 905.

Figure 9D:
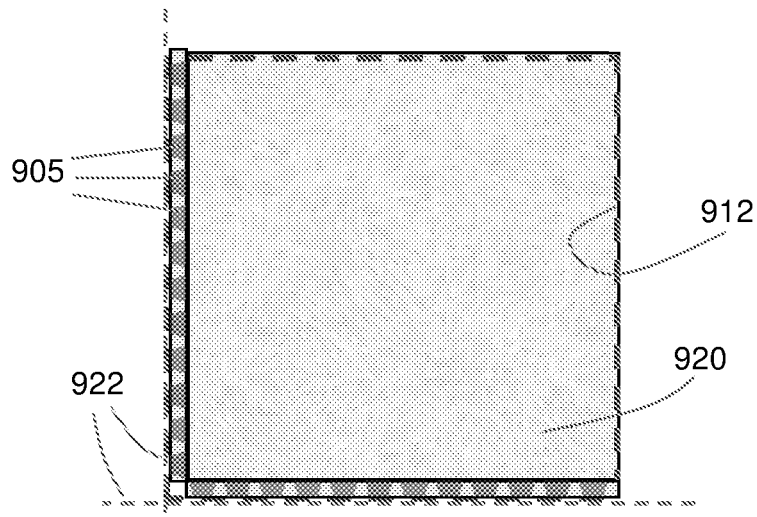
Figure 9E:
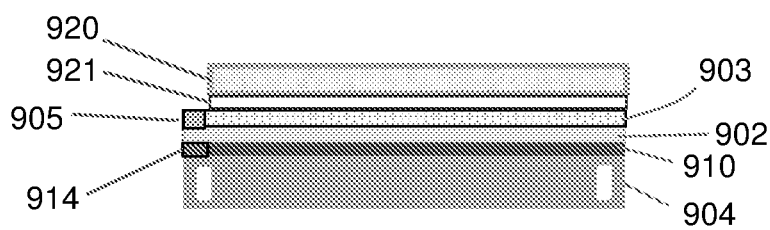
Figure 9F:
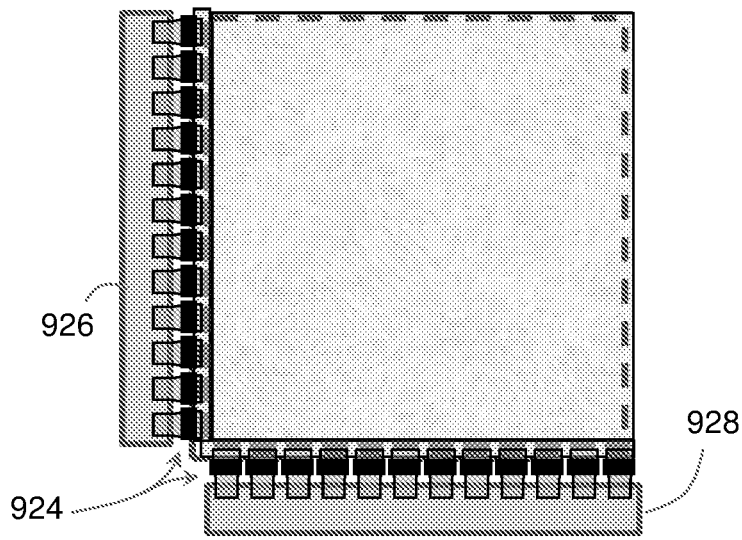
Figure 9G:
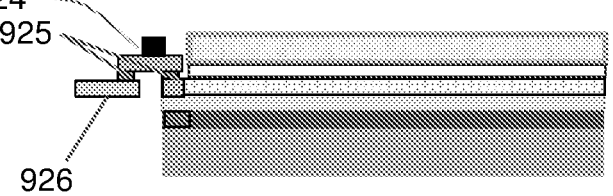

After the scintillator 920 (FIG. 9D) is applied over the imaging array 903 as described above with respect to FIG. 8D, a singulation process is performed whereby the secondary substrate 904 is removed along break lines 912 and the ESD protection circuits 907 are cut off along cut lines 922, as shown in FIG. 9D and cross-section FIG. 9E. Either step, removal of substrate periphery or ESD circuits, may be performed first. In one embodiment, if an adhesive 911 is used on the peripheral regions of the secondary substrate 904, the portion of the polyimide layer 902 near the bond pads 905 are detached from the secondary substrate 904 before breaking or cutting the peripheral regions of the secondary substrate 904 along the break lines 912. In this embodiment, the break lines 912 and the cut lines 922 are substantially aligned with each other in a vertical direction (perpendicular to a plane of the image array 903) which provides a feature of the disclosed process whereby the bond pads 905 are supported by a denser portion 914 on the secondary substrate 904 to better withstand the heat and pressure of the TAB bond process. FIG. 9F, and cross-section FIG. 9G, show the resulting module assembly after COFs 924 are electrically attached to the bond pads 905 and array control electronics such as by using a TAB process. The array control electronics may include row drivers 926 and read out circuits 928. In one embodiment, anisotropic conductive film 925 may be used to attach the COFs 924 to respective bond pads 905 and to electrical contact areas on the array control electronics. In the embodiment of FIG. 9E where the bond pads 905 are above the secondary substrate 904, the entire stack of polyimide 902, substrate bond pads 905, adhesive layer 910, and secondary substrate 904 must tolerate the high pressure and temperature of the TAB bonding process. Fiducial marks described herein may be used to align the bond pads 905 to the contact pads of the COF 924 via a camera viewing system.

Figure 10A:
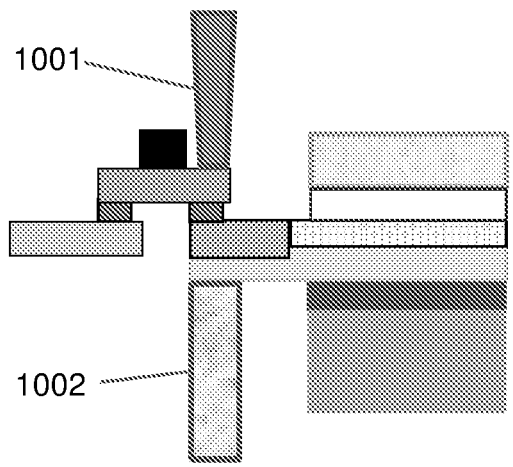
FIGS. 10A-10B are close-up schematic diagrams of FIGS. 8H and 9G, respectively.
Figure 10B:
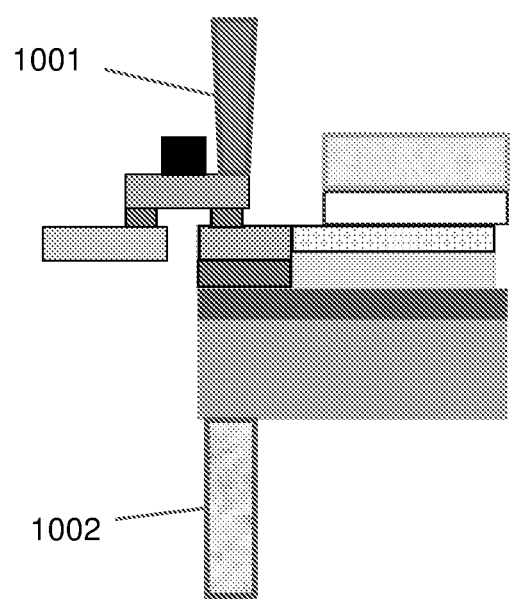

FIGS. 10A-10B show close up views of FIGS. 8H and 9G, respectively, wherein a TAB attachment tool having a heating head 1001 and a backup stage 1002 are positioned to attach contact pads of the COF 824, 924 to the sensor array bond pads 805, 905.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

U.S. Patent Application Ser. No. 62/336,773, filed May 16, 2016, in the name of Wojcik et al., and entitled FLEXIBLE SUBSTRATE MODULE AND FABRICATION METHOD, hereby incorporated by reference herein in its entirety.

This application is related in certain respects to Patent Application PCT/US17/31522, filed May 8, 2017, in the name of Heiler et al., and entitled FLEXIBLE SUBSTRATE CHIP-ON FLEX REPAIR, which is incorporated herein by reference in its entirety.

The invention claimed is:

1. A digital radiographic image sensor comprising:
   a flexible first substrate;
   an image sensor array formed on a first side of the first substrate;
   a bonding pad formed in a peripheral region outside the array on the first side of the first substrate; and
   a second substrate having a top surface attached to a second side of the first substrate opposite the first side, the second substrate comprising:
      a scribed or perforated break line to enable removal of a peripheral region of the second substrate along the break line; and
      the top surface having a first adhesive in a first portion thereof, wherein the adhesive contacts the second side of the first substrate directly opposite the image sensor array, and a second adhesive in a second portion thereof, wherein the second adhesive contacts the second side of the first substrate outside of the region directly opposite the image sensor array.

2. The image sensor panel of claim 1, wherein the break line is scribed or perforated into a bottom surface of the second substrate opposite the top surface, the break line closer to an unbroken edge of the second substrate than to a center of the second substrate.

3. The image sensor panel of claim 2, further comprising an ESD protection circuit in the peripheral region outside the array and outside the bonding pad on the first side of the first substrate, the ESD protection circuit configured to be cut off along a linear cut line between the bonding pad and the ESD protection circuit, the cut line closer to an uncut edge of the first substrate than the break line is to the unbroken edge of the second substrate.

4. The image sensor panel of claim 2, wherein the first substrate and the bonding pad formed thereon extend beyond a broken edge of the second substrate.

5. The image sensor panel of claim 4, wherein the broken edge of the second substrate is formed by the removal of the peripheral region of the second substrate along the break line.

6. The image sensor panel of claim 2, further comprising an ESD protection circuit in the peripheral region outside the array and outside the bonding pad on the first side of the first substrate, the ESD protection circuit configured to be cut off along a cut line between the bonding pad and the ESD protection circuit, the cut line configured to be vertically aligned with the break line in the second substrate.

7. The image sensor panel of claim 6, wherein a broken edge of the second substrate is formed by the removal of the peripheral region of the second substrate along the break line, and wherein the broken edge is aligned with a cut off edge of the first substrate, the cut off edge formed by cutting off the ESD protection circuit along the cut line.

8. The image sensor panel of claim 1, wherein the first adhesive comprises a temperature tolerance greater than the second adhesive and greater adhesion than the second adhesive.

9. The image sensor panel of claim 1, wherein a coefficient of thermal expansion of the second substrate is equivalent to that of the first substrate.

10. The image sensor panel of claim 1, wherein a coefficient of thermal expansion of the second substrate is within 5× that of the first substrate.

11. The image sensor panel of claim 1, wherein the second substrate further comprises regions of reduced aggregate thickness configured to allow a light source positioned beneath the second substrate to illuminate contact regions on the array.

12. The image sensor panel of claim 11, wherein the contact regions comprise bonding pads or probe tester contact areas.

13. The image sensor panel of claim 1, wherein the second substrate further comprises regions of increased temperature and pressure tolerance proximate peripheral regions of the second substrate.

14. The image sensor panel of claim 1, wherein the second substrate comprises x-ray attenuation material, an x-ray attenuation layer, a conductive layer, a planarization layer, or a combination thereof.

* * * * *